(12) United States Patent
Pardo Peris et al.

(10) Patent No.: US 11,849,537 B2
(45) Date of Patent: Dec. 19, 2023

(54) FILTER MODULE FOR REDUCING DIFFERENTIAL AND COMMON MODE NOISE AND METHOD TO MANUFACTURE SUCH A FILTER MODULE

(71) Applicant: Mahle International GmbH, Stuttgart (DE)

(72) Inventors: Juan Francisco Pardo Peris, Xàtiva (ES); Anton Esmoris Bertoa, Valencia (ES); Alejandro Hiroshi Closa Kobayashi, Valencia (ES)

(73) Assignee: Mahle International GmbH

( * ) Notice: Subject to any disclaimer, the term of this patent is extended or adjusted under 35 U.S.C. 154(b) by 319 days.

(21) Appl. No.: 17/430,582

(22) PCT Filed: Feb. 11, 2020

(86) PCT No.: PCT/EP2020/053430
§ 371 (c)(1),
(2) Date: Aug. 12, 2021

(87) PCT Pub. No.: WO2020/165144
PCT Pub. Date: Aug. 20, 2020

(65) Prior Publication Data
US 2022/0132652 A1 Apr. 28, 2022

(30) Foreign Application Priority Data
Feb. 12, 2019 (EP) .................... 19156560

(51) Int. Cl.
*H05K 1/02* (2006.01)
*H03H 3/00* (2006.01)
*H03H 7/42* (2006.01)

(52) U.S. Cl.
CPC ............ *H05K 1/0233* (2013.01); *H03H 3/00* (2013.01); *H03H 7/427* (2013.01);
(Continued)

(58) Field of Classification Search
CPC ............... H05K 1/0233; H05K 1/0231; H05K 2201/086; H05K 2201/0902;
(Continued)

(56) References Cited

U.S. PATENT DOCUMENTS 5,119,059 A 6/1992 Covi et al.
7,597,560 B2 10/2009 Korich et al.
(Continued)

FOREIGN PATENT DOCUMENTS

| DE | 102010030917 A1 | 4/2011 | |
|---|---|---|---|
| DE | 102005013509 B4 * | 7/2019 | ............... H02J 3/01 |
| KR | 1020130066042 A | 7/2018 | |

OTHER PUBLICATIONS

English abstract for KR-1020130066042.
European Search Report for EP-19156560.5, dated Sep. 17, 2019.

*Primary Examiner* — Samuel S Outten
*Assistant Examiner* — Kimberly E Glenn
(74) *Attorney, Agent, or Firm* — Fishman Stewart PLLC (57) ABSTRACT

A filter module for reducing differential and common mode electrical noise may include at least a first electrically conductive busbar and a second electrically conductive busbar spaced apart from the first busbar, an at least partially electrically conductive housing at least partially enclosing the first busbar and the second busbar, at least a first common mode choke and a second common mode choke arranged in the housing and spaced apart from each other, at least a first bypass capacitor electrically connected to the first busbar and the second bus bar, at least a second bypass capacitor electrically connected to the first busbar and a midpoint, and at least a third bypass capacitor electrically connected to the second busbar and the midpoint.

21 Claims, 5 Drawing Sheets

(52) U.S. Cl.
CPC ..... *H05K 1/0231* (2013.01); *H05K 2201/086* (2013.01); *H05K 2201/09027* (2013.01); *H05K 2201/1003* (2013.01); *H05K 2201/10015* (2013.01); *H05K 2201/10265* (2013.01); *H05K 2201/10272* (2013.01); *H05K 2201/10409* (2013.01)

(58) Field of Classification Search
CPC . H05K 2201/10015; H05K 2201/1003; H05K 2201/10265; H05K 2201/10272; H05K 2201/10429; H03H 3/00; H03H 7/247
See application file for complete search history.

(56) References Cited

U.S. PATENT DOCUMENTS

| | | |
|---|---|---|
| 8,476,989 B2 | 7/2013 | Herron et al. |
| 2018/0049314 A1 | 2/2018 | Amaducci et al. |

\* cited by examiner

FILTER MODULE FOR REDUCING DIFFERENTIAL AND COMMON MODE NOISE AND METHOD TO MANUFACTURE SUCH A FILTER MODULE

CROSS-REFERENCE TO RELATED APPLICATIONS

This application claims priority to International Patent Application No. PCT/EP2020/053430 filed on Feb. 11, 2020, which also claims priority to European Patent Application EP 19156560.5 filed Feb. 12, 2019, each of which is hereby incorporated by reference in its entirety.

TECHNICAL FIELD

The present invention relates to an electric and/or electronic filter module for reducing differential and common mode electrical noise as well as to a method to manufacture such a filter module.

Such filter modules are applied to protect vulnerable components from electromagnetic interference. On the other hand, such filters are used to improve the required electromagnetic compatibility of components emitting electromagnetic interference.

These electromagnetic interferences can be classified into differential and common mode electrical noise. Each of these types of interference or noise requires its own filters which are in many cases designed as low-pass filters. Additionally, common-mode chokes are used for suppressing common-mode noise. When using low-pass filters, the limit frequency is selected at a frequency far above the frequency that the electrical signal in the electrical component requires for operation. Thus, the electrical signal in the electrical component is not affected by the filter.

BACKGROUND

U.S. Pat. No. 5,119,059 A describes a dual mode choke reducing both differential and common mode noise. The dual mode choke comprises ferrite cores that are installed around busbars. The ferrite cores are designed in such that they create a single turn inductor with respect to each bus bar in order to suppress differential noise. Additionally, the ferrite cores provide a single turn inductor with respect to both bus bars in order to suppress common mode noise.

Since the dual mode choke requires additional core martial compared to an usual common mode choke, the weight and material costs are increased. Additionally, the gap between the busbars has to fit to the thickness of the respective part of the ferrite core resulting in a higher space requirement.

U.S. Pat. No. 7,597,560 B2 describes an interface assembly for an inverter of a vehicle including an interface, a plurality of bus bars, a circuit board, and a clip. The bus bars are equipped with a single common mode choke. During the manufacturing process it is necessary to guide the busbars through holes in the clip contacts which requires an accurate positioning. The clip contacts are also made out of several components and are located away from the circuit board which makes accurate positioning of the clip contacts difficult. Additionally, the use of such clips results in a higher space requirement.

DE 10 2010 030 917 A1 describes a circuit board which is at least partially surrounded by a single common mode choke. Thus, the common mode choke has to fit to the dimension of the circuit board resulting in an increased weight as well as in increased material costs.

KR 1020130066042 A describes a voltage connector with two busbars and a single common mode choke. Since the busbars are embedded in the common mod choke, the manufacturing process is expensive and cost-intensive.

SUMMARY

The present invention is based on the task of specifying a filter module which is simpler and more cost-effective to manufacture.

This problem is solved according to the invention by the subject matter of the independent claims. Advantageous embodiments are the subject matter of the dependent claims.

The present invention is based on the general concept that a preassembled circuit board with required bypass capacitors is installed between two common mode chokes.

The innovative filter module for reducing differential and common mode electrical noise comprises at least a first electrically conductive busbar and a second electrically conductive busbar being spaced apart. The first busbar and/or the second busbar each may have a cross-section with a rectangular shape. The rectangular shaped cross-section may have two longitudinal edges which are spaced apart and connected by two narrow edges. The longitudinal edges may be longer than the narrow edges. The first busbar and/or the second busbar may have at least partially a u-shaped form.

The filter module comprises an at least partially electrically conductive housing which at least partially encloses the first busbar and the second busbar. The housing may be formed by a first portion and a second portion. The first portion or the second portion may be made from an electrically non-conductive material, for example plastic material. The filter module may comprise an electrically conductive housing which at least partially encloses the first busbar and the second busbar.

At least a first common mode choke and a second common mode choke are arranged in the housing and being spaced apart each other. The first common mode choke is formed by a first ferrite core through which the first busbar and the second busbar extend. The first ferrite core creates a single turn inductor with respect to the first busbar and the second busbar in order to suppress common mode noise. The second common mode choke is formed by a second ferrite core through which the first busbar and the second busbar extend. The second ferrite core creates a single turn inductor with respect to the first busbar and the second busbar in order to suppress common mode noise. The first ferrite core and the second ferrite core may be substantially formed identically. The first ferrite core and the second ferrite core each may be arranged at a distance from the first busbar and the second busbar. Thus, the first ferrite core and the second ferrite core each may enclose a part of the first busbar and the second busbar without being in contact with the first busbar and the second busbar. The first busbar may extend between a first terminal and a second terminal while the second busbar may extend between a third terminal and a fourth terminal.

The filter module comprises at least a first bypass capacitor which is electrically connected to the first busbar and the second busbar. The first bypass capacitor is used to reduce differential mode noise.

Additionally, the filter module comprises at least a second bypass capacitor which is electrically connected to the first busbar and a midpoint. The filter module comprises at least a third bypass capacitor which is electrically connected to the second busbar and the midpoint, said midpoint being electrically connected to the housing. The second bypass capacitor and the third bypass capacitor are used to reduce common mode noise.

The first bypass capacitor, the second bypass capacitor and the third bypass capacitor are arranged on a circuit board. The circuit board is arranged in the housing between the first ferrite core and the second ferrite core which means that at least a part of the circuit board may be arranged between the first ferrite core and the second ferrite core.

The circuit board has at least a first spring contact and a second spring contact. The first spring contact provides an electrical connection between the circuit board and the first busbar while the second spring contact provides an electrical connection between the circuit board and the second busbar. The circuit board may be double-T-shaped. The circuit board may have two recesses which a spaced apart. At least a part of the first ferrite core may be arranged in a first recess while at least a part of the second ferrite core may be arranged in a second recess.

The first spring contact and the second spring contact may have dimensions smaller than the dimensions of the cross-section of the busbars. The dimensions of the first spring contact and the second spring contact may be smaller than the length of the longitudinal edge viewed in cross-section of one busbar.

The circuit board may be a printed circuit board proving required electrical lines in order to realize the above mentioned electrical connections.

The first bypass capacitor may be electrically connected to the first busbar and the second busbar by the first spring contact and the second spring contact, respectively. The electrical connection between the respective spring contact and the first bypass capacitor may be formed by electrical lines on the circuit board.

The second bypass capacitor may be connected to the first busbar and to the midpoint by the first spring contact and electrical lines on the circuit board, respectively. The electrical connection between the first spring contact and the first bypass capacitor may be formed by electrical lines on the circuit board.

The third bypass capacitor may be connected to the second busbar and to the midpoint by the second spring contact and electrical lines on the circuit board, respectively. The electrical connection between the second spring contact and the third bypass capacitor may be formed by electrical lines on the circuit board.

The capacitors arranged on the circuit board by through-hole soldering. The filter module according to the invention can be produced simpler and more cost-effectively.

In an advantageous embodiment of the solution according to the invention, the first busbar and/or the second busbar have at least partially an insulating sheath.

The first busbar and the second busbar each may have a separated insulating sheath. The first busbar and the second busbar may have a common insulating sheath. The insulating sheath may be made of plastic.

The insulating sheath may extend between the first terminal and the first ferrite core along the first busbar, the insulating sheath may form a mounting for the first ferrite core. The insulating sheath may extend between the second ferrite core and the second terminal along the first busbar, the insulating sheath may form a mounting for the second ferrite core. The part of the first busbar being arranged between the first ferrite core and the second ferrite core may be without insulating sheath.

The insulating sheath may extend between the third terminal and the first ferrite core along the second busbar, the insulating sheath may form a mounting for the first ferrite core. The insulating sheath may extend between the second ferrite core and the fourth terminal along the second busbar, the insulating sheath may form a mounting for the second ferrite core. The part of the second busbar being arranged between the first ferrite core and the second ferrite core may be without insulating sheath.

The insulating sheath avoids a short circuit between the first busbar and the second busbar and fulfils safety aspects.

In an advantageous embodiment of the solution according to the invention, the first ferrite core has a toroidal shape and/or the second ferrite core has a toroidal shape. Given a toroidal shape, the ferrite material of the respective ferrite core is arranged between inner diameter and an outer diameter. The inner diameter may be larger than a distance between the first busbar and the second busbar across the circuit board. The inner diameter and the outer diameter may be smaller than a cross length of the circuit board. A toroidal-shaped first ferrite core may have a rectangular, preferably a square-shaped, cross-section. A toroidal-shaped second ferrite core may have a rectangular, preferably a square-shaped, cross-section.

A ferrite core with toroidal shape provides a rotationally symmetrical guidance of magnetic field reducing interference effects.

In an advantageous embodiment of the solution according to the invention, the first ferrite core is made of one piece and/or the second ferrite core is made of one piece. This simplifies the production of the filter module and reduces the production costs.

In an advantageous embodiment of the solution according to the invention, the first spring contact comprises at least two spring fingers and/or the second spring contact comprises at least two spring fingers. The first spring contact may comprise five spring fingers and/or the second spring contact may comprise five spring fingers. The spring fingers of the respective spring contact may be spaced apart to each other.

In an advantageous embodiment of the solution according to the invention, the first bypass capacitor is a class-X capacitor while the second bypass capacitor and the third bypass capacitor are class-Y capacitors in order to fulfil necessary safety requirements.

In an advantageous embodiment of the solution according to the invention, at least a part of the insulating sheath of the first busbar and/or the second busbar forms a mounting for the first ferrite core and/or for the second ferrite core. Since the mounting for the respective ferrite core is integrally formed by a part of the insulating sheath, the production of the filter module of the filter module is simplified by reducing the required production steps.

In an advantageous embodiment of the solution according to the invention, at least a fourth bypass capacitor which is electrically connected to the first busbar and the second busbar. Additionally, at least a fifth bypass capacitor is electrically connected to the first busbar and the midpoint, while at least a sixth bypass capacitor is electrically connected to the second busbar and the midpoint. The fourth bypass capacitor, the fifth bypass capacitor and the sixth bypass capacitor being arranged on the circuit board. Such a design provides an improved filtering effect.

In an advantageous embodiment of the solution according to the invention, the first busbar and the second busbar divide the circuit board in a first part and a second part. The first part and the second part of the circuit board may occupy substantially an equal share of the surface area of the circuit board.

In an advantageous embodiment of the solution according to the invention, the first bypass capacitor, the second bypass capacitor and the third bypass capacitor are arranged on the first part of the circuit board while the fourth bypass capacitor, the fifth bypass capacitor and the sixth bypass capacitor are arranged on the second part of the circuit board. This provides a compact assembly of the filter module.

In an advantageous embodiment of the solution according to the invention, the first busbar and the second busbar each are spaced apart from the circuit board, and/or the first spring contact forms an electrical connection between the circuit board and the first busbar, while the second spring contact forms an electrical connection between the circuit board and the second busbar.

The first spring contact may comprise at least two spring fingers and/or the second spring contact may comprise at least two spring fingers. The first spring contact may comprise five spring fingers and/or the second spring contact may comprise five spring fingers. The spring fingers of the respective spring contact may be spaced apart to each other. The spring fingers of the respective spring contact may be arranged in a row.

The first busbar and the second busbar are not pressed onto the circuit board, in particular the busbar are not pressed onto conductor track and/or electrical line of the circuit board. This has the advantage that the clips and/or spring contacts do not need to exert as much pressure, and they can be smaller compared to clips and/or spring contacts which press a busbar onto the circuit board. Furthermore, the busbars can be mounted simply by moving them in a direction perpendicular to the circuit board.

Additionally, the spring contacts provide a good trade-off between electric resistance and thermal resistance: The impedance between the busbars and the circuit board is low enough for a good response at high frequency while at the same time the thermal resistance of the spring contacts is high enough to minimize heat transfer from the busbar to the circuit board as well as to minimize the heat transmission to the rest of the circuit components.

Since the first busbar and the second busbar each are spaced apart from the circuit board, the heat conduction between the busbars and the circuit board is reduced The mechanical concept, in particular the distribution of spring contacts and/or spring fingers in rows and the busbar placement as well orientation, improves and/or increases the thermal insulation. This thermal insulation cannot be guaranteed with other solutions in which the busbars are in direct contact with the circuit board and/or circuit board tracks using also their largest possible contact area.

The connection by means of spring contacts and/or spring fingers, although it may be rigid by means of the structural plastic that fixes components, PCB and busbar, such a connection may provide tolerance in the range of micrometers to mitigate on the one hand mechanical imperfections and on the other hand to stress in the union due to different coefficients of expansion of the materials involved in the electrical contact.

In an advantageous embodiment of the solution according to the invention, the surface of the first busbar facing the circuit board is minimized and wherein the surface of the second busbar facing the circuit board is minimized.

Due to the minimized surface of the respective busbar facing the circuit board, thermal radiation affecting the circuit board may be minimized.

The first busbar may be formed and/or oriented with respect to the circuit board in such way that the surface of the first busbar facing the circuit board is minimized. The second busbar may be formed and/or oriented with respect to the circuit board in such way that the surface of the first busbar facing the circuit board is minimized.

In an advantageous embodiment of the solution according to the invention, the first spring contact is electrically connected to a conductor track and/or electrical line of the circuit board, and the second spring contact is electrically connected to a conductor track and/or electrical line of the circuit board.

In an advantageous embodiment of the solution according to the invention, the first busbar and the second busbar are facing the same side of the circuit board, and/or the first spring contact and the second spring contact are arranged on the same side of the circuit board.

Since the busbars may be mounted on the same side of the circuit board, the Also the busbars can be mounted simply by moving in a direction perpendicular to the circuit board. Due to this, the assembly process is easier and cheaper.

In an advantageous embodiment of the solution according to the invention, the first spring contact and the second spring contact each are formed from electrically conductive material.

The invention relates to a method to manufacture a filter module as described above. The method comprising the following steps: providing an at least partially electrically conductive housing with at least a first portion and a second portion, providing at least a first electrically conductive busbar and a second electrically conductive busbar with at least two ferrite cores. The first busbar, the second busbar and ferrite cores are placed in the first portion of the housing.

In an advantageous embodiment of the solution according to the invention, the method further comprises the following steps: providing a circuit board which is preassembled with at least one bypass capacitor, a first spring contact and a second spring contact. The circuit board is placed between the ferrite cores such that the first busbar and second busbar are at least partially arranged between the circuit board and the first portion of the housing, while the first spring contact and the second spring contact electrically contacting the first busbar and the second busbar, respectively. The circuit board is attached to the first portion of the housing.

In an advantageous embodiment of the solution according to the invention, the circuit board is attached to the first portion of the housing by at least one screw.

In an advantageous embodiment of the solution according to the invention, the electrical contact between the midpoint of the circuit board and the housing is adjusted by tightening the screw.

In an advantageous embodiment of the solution according to the invention, the second portion of the housing is attached to the first portion of the housing.

In an advantageous embodiment of the solution according to the invention, the first busbar and the second busbar are connected to the first spring contact and to the second spring contact, respectively, by moving the preassembled circuit board towards the first busbar and the second busbar along a direction perpendicular to the circuit board surface on which the first spring contact and the second spring contact are preassembled.

Due to this, the assembly process is easier and cheaper.

In an advantageous embodiment of the solution according to the invention, the first spring contact and the second spring contact are soldered onto the circuit board in the same process step in which the other component are soldered onto the circuit board. Since the first spring contact and the second spring contact may be soldered onto the circuit board as one more component (in the same process), in a subsequent connection process between them and the busbars, no extra or additional fixing element is used or required. It is sufficient with the fasteners used to assemble the part.

Due to this, the assembly process is easier and cheaper since less components and less process steps are required.

Further important features and advantages of the invention emerge from the dependent claims, from the drawings and from the associated description of the figures with reference to the drawings.

It goes without saying that the features mentioned above and those which have yet to be explained below can be used not only in the respectively stated combination, but also in different combinations or on their own without departing from the scope of the present invention.

Preferred exemplary embodiments of the invention are illustrated in the drawings and are explained in more detail in the description below, wherein the same reference signs refer to identical or similar or functionally identical components.

BRIEF DESCRIPTION OF THE DRAWINGS

In the drawings, in each case schematically.

DETAILED DESCRIPTION

Figure 1:
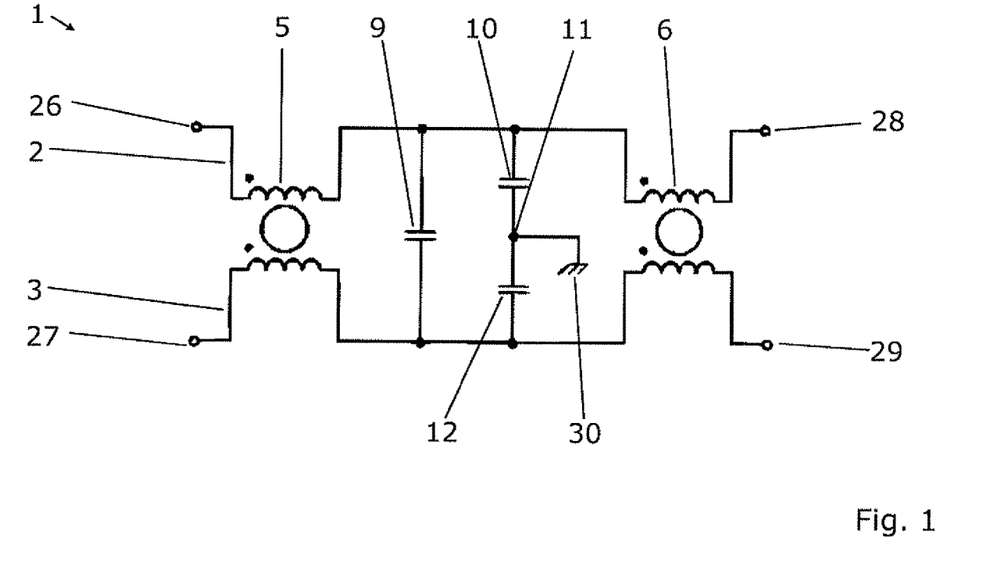
FIG. 1 shows a circuit diagram of the filter module.

FIG. 1 shows a circuit diagram of the filter module 1 having a first electrically conductive busbar 2 and a second electrically conductive busbar 3 which are spaced apart. The first busbar 2 extends between the first terminal 26 enter the second terminal 28 while the second busbar 3 extends between a third terminal 28 and the fourth terminal 29.

The filter module 1 comprises a first common mode choke 5 and a second common mode choke 6 which are spaced apart each other. Additionally, the filter module 1 at least a first bypass capacitor 9 which is electrically connected to the first busbar 2 and the second busbar 3, at least a second bypass capacitor 1) which is electrically connected to the first busbar 2 and a midpoint 11, at least a third bypass capacitor 12 which is electrically connected to the second busbar 3 and the midpoint 11. The midpoint 11 is electrically connected to a housing 4 which is shown in the FIG. 7 and FIG. 8. This connection between the midpoint 11 and the housing 4 is depicted by the chassis ground sign 30.

Figure 2:
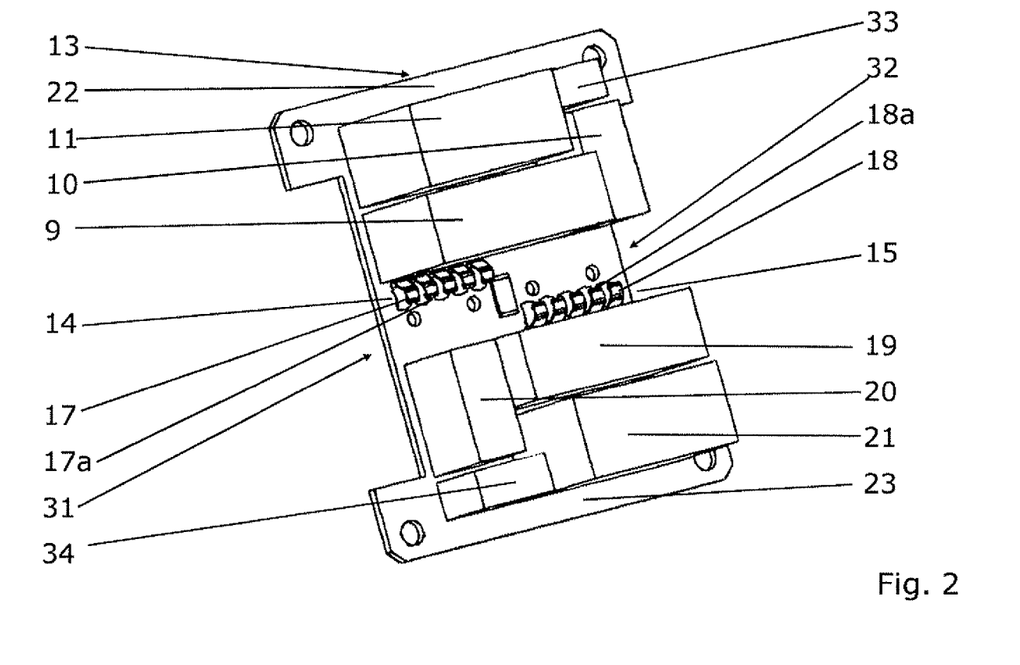
FIG. 2 shows a perspective view of the preassembled circuit board of the filter module.
Figure 3:
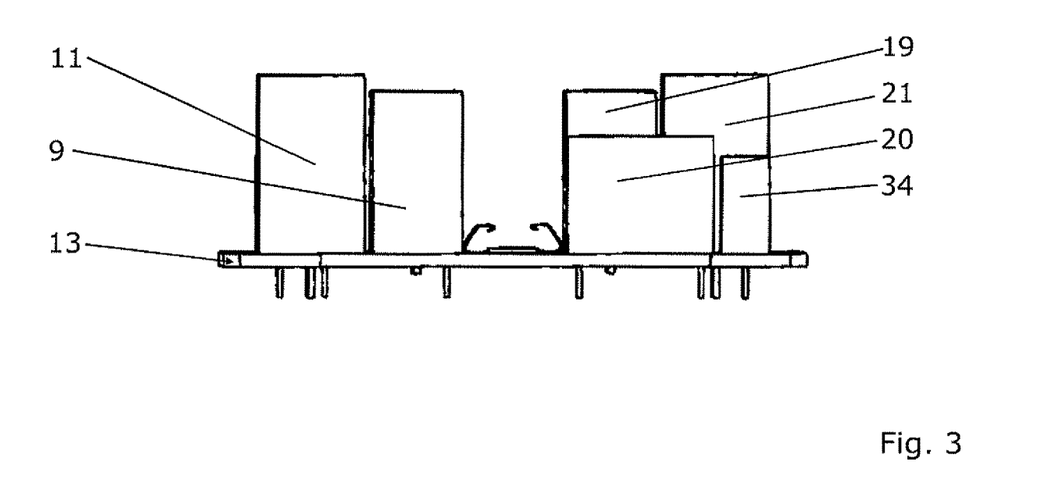
FIG. 3 shows a side view of the preassembled circuit board of the filter module.
Figure 4:
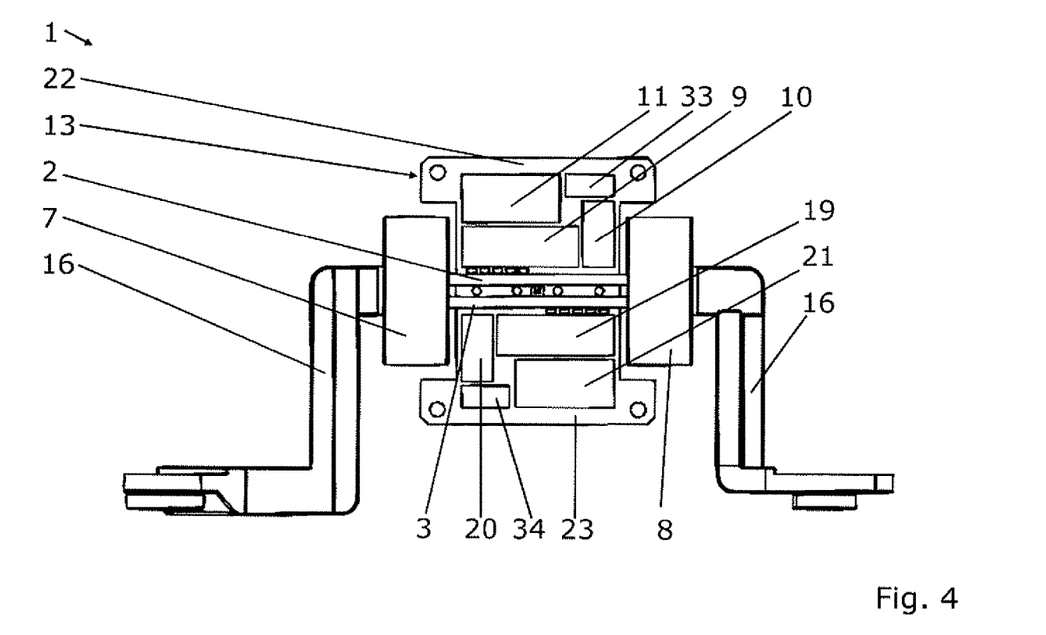
FIG. 4 shows a top view of the preassembled circuit board with busbars.
Figure 5:
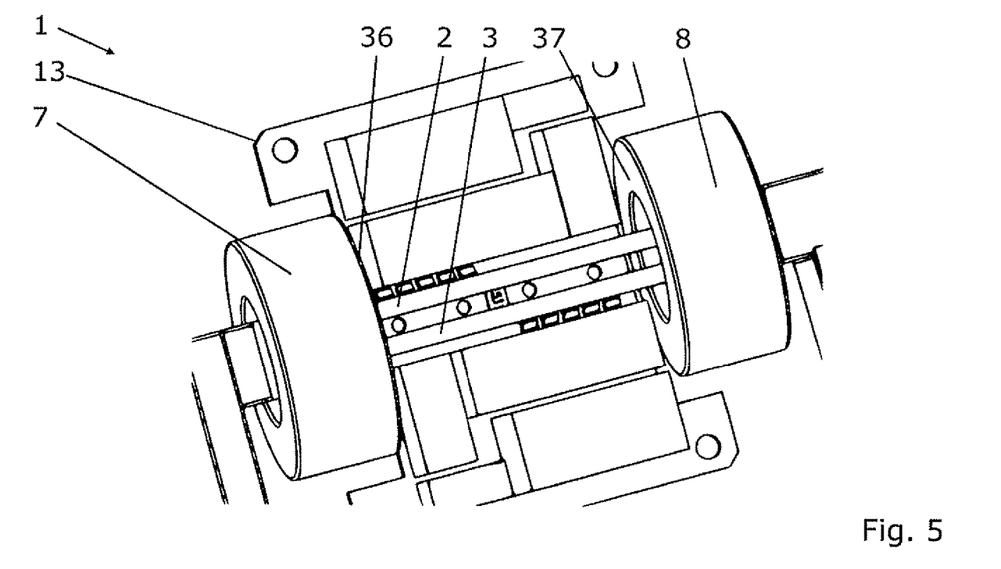
FIG. 5 shows a perspective view of the preassembled circuit board with busbars.

FIG. 2 shows a perspective view of a preassembled circuit board 13 of the filter module 1 while FIG. 3 shows a side view of the preassembled circuit board 13 of the filter module 1. The first bypass capacitor 9, the second bypass capacitor 10 and the third bypass capacitor 12 being arranged on a circuit board 13. Compared to the circuit diagram in FIG. 1, the filter modules 1 shown in the FIGS. 2 to 9 has a symmetric structure which means the bypass capacitors shown in FIG. 1 are double available. One set of bypass capacitors is arranged on a first part 22 of the circuit board 13 while another set of bypass capacitors is arranged on a second part 23 of the circuit board 13. The circuit board 13 is divided by the first busbar 2 and the second busbar 3 in the first part 22 and a second part 23 as shown in FIG. 4 or FIG. 5. The filter module 1 comprises at least a fourth bypass capacitor 19 which is electrically connected to the first busbar 2 and the second busbar 3, at least a fifth bypass capacitor 20 which is electrically connected to the first busbar 2 and the midpoint 11, at least a sixth bypass capacitor 21 which is electrically connected to the second busbar 3 and the midpoint 11. The fourth bypass capacitor 19, the fifth bypass capacitor 20 and the sixth bypass capacitor 21 are arranged on the circuit board 13. Additionally, a seventh capacitor 33 and an eighth capacitor 34 are installed on the circuit board 13.

Figure 6:
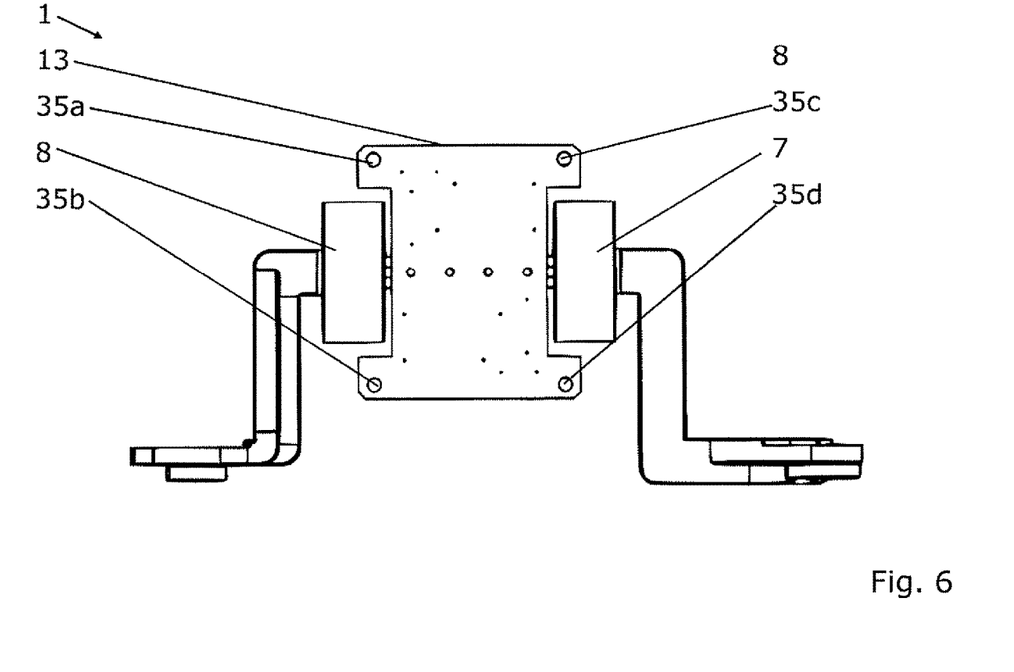
FIG. 6 shows a rearview of the preassembled circuit board with busbars.

The circuit board 13 is double-T-shaped and comprises a first recess 31 as well as a second recess 32 which are spaced apart each other. As shown in FIG. 6, the circuit board 13 comprises a first hole 35a, a second hole 35b, a third hole 35c and a fourth hole 35d.

The circuit board 13 has at least a first spring contact 14 and a second spring contact 15. As shown in FIG. 4 and FIG. 5, the first spring contact 14 provides an electrical connection between the circuit board 13 and the first busbar 2, while the second spring contact 15 provides an electrical connection between the circuit board 13 and the second busbar 3.

Figure 9:
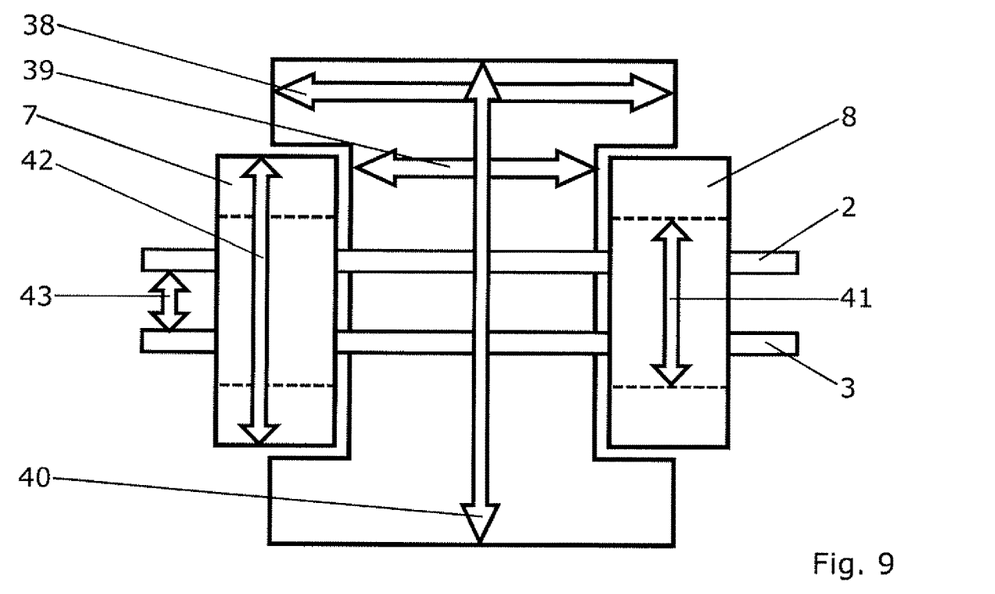
FIG. 9 shows relevant dimensions of the circuit board.

The first spring contact 14 and the second spring contact 15 are spaced apart each other along a direction substantially parallel to a cross length 40 of the circuit board 13. The first spring contact 14 and the second spring contact 15 are spaced apart as well as shifted to each other along a direction substantially parallel to a first longitudinal length 38 of the circuit board 13. The cross length 40 and the first longitudinal length 38 of the circuit board 13 are depicted in FIG. 9.

The first spring contact 14 comprises at least two spring fingers 17 and 17a while the second spring contact 15 comprises at least two spring fingers 18 and 18a. Preferably, first spring contact 14 comprises and the second spring contact 15 each comprises five spring fingers. The spring finger are spaced apart each other.

FIG. 4 shows a top view of the preassembled circuit board 13 with busbars 2 and 3 while FIG. 5 shows a perspective view of this arrangement. The first common mode choke 5 is formed by a first ferrite core 7 through which the first busbar 2 and the second busbar 3 extend. The second common mode choke 6 is formed by a second ferrite core 8 through which the first busbar 2 and the second busbar 3 extend. At least a part of the first ferrite core 7 is arranged in the first recess 31 while at least a part of the second ferrite core 8 is arranged in the second recess 32. The circuit board 13 is arranged in the housing 4 between the first ferrite core 7 and the second ferrite core 8. The first ferrite core 7 has a toroidal shape as well as the second ferrite core 8 has a toroidal shape. The first ferrite core 7 is made of one piece and the second ferrite core 8 is made of one piece.

The first busbar 2 and the second busbar 3 have at least partially a u-shaped form. The u-shaped part of the first and second busbar 2, 3 is accommodated in the housing 4. The first busbar and the second busbar have at least partially an insulating sheath 16. The insulating sheath 16 extends between the first terminal 26 and the first ferrite core 7 along the first busbar 2 and the second busbar 3. Additionally, the insulating sheath 16 extends between the second ferrite core 8 and the second terminal 28 along the first busbar 2 and/or the second busbar 3. The insulating sheath 16 extends between the third terminal 27 and the first ferrite core 7 along the first busbar 2 and the second busbar 3. Additionally, the insulating sheath 16 extends between the second ferrite core 8 and the fourth terminal 29 along the first busbar 2 and/or the second busbar 3.

The part of the first busbar 2 and second busbar 3 being arranged between a front side 36 of the first ferrite core 7 and a front side 37 of the second ferrite core 8 is without insulating sheath.

At least a part of the insulating sheath 16 of the first busbar and/or the second busbar forms a mounting for the first ferrite core 7 and/or for the second ferrite core 8. Such a mounting for the respective ferrite core is integrally formed by a part of the insulating sheath 16.

FIG. 9 shows the relevant dimensions of the circuit board 13 as well as of the first ferrite core 7 and second ferrite core 8. The circuit board 13 has a cross length 40 which is larger than an outer diameter 42 of the first ferrite core 7 and/or second ferrite core 8. The circuit board 13 has a first longitudinal length 38 which is larger than a second longitudinal length 39. The first longitudinal length 38 and the second longitudinal length 39 are substantially parallel to each other while they a transversely aligned to the cross length 40. The first busbar 2 and the second busbar 3 are spaced apart; the distance 43 between them on the circuit board 13 is smaller than an inner diameter 41 of the first ferrite core 7 and/or second ferrite core 8.

Figure 7:
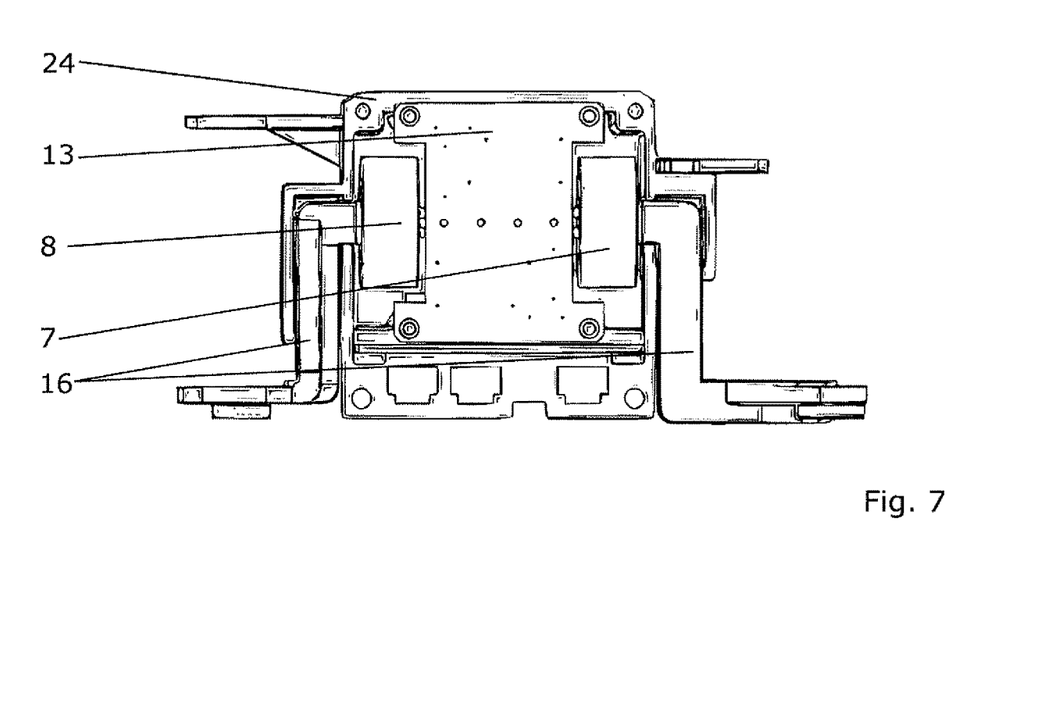
FIG. 7 shows a rear view of the preassembled circuit board with busbars which are inserted in a first portion of the housing.
Figure 8:
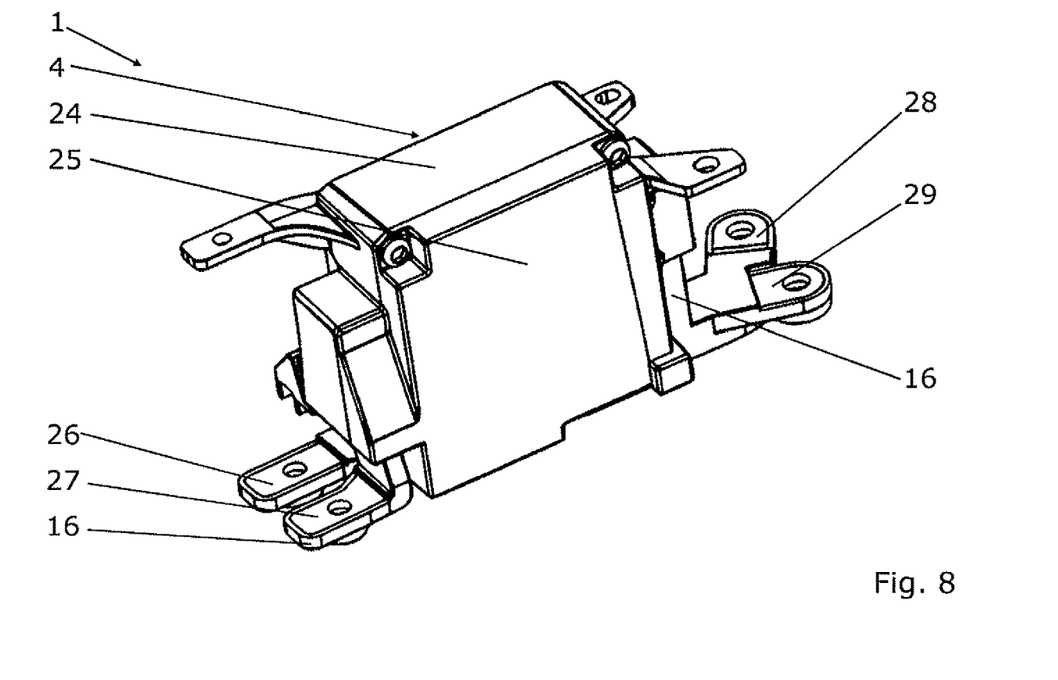
FIG. 8 shows a perspective view of the filter module

The production of filter module 1 is explained according to FIG. 7 and FIG. 8. A housing 4 with at least a first electrically conductive portion 24 and a second portion 25 is provided. Additionally, the first electrically conductive busbar 2 and the second electrically conductive busbar 3 with mounted first ferrite core 7 and second ferrite core 8 are provided. The first busbar 2, the second busbar 3 with the ferrite cores 7 and 8 are placed in the first portion 24 of the housing 4.

The circuit board which is preassembled with the bypass capacitor, the first spring contact 14 and the second spring contact 15 is provided. The circuit board 13 is placed between the first ferrite core 7 and the second ferrite core 8 such that the first busbar 2 and second busbar 3 are at least partially arranged between the circuit board 13 and the first portion 24 of the housing 4. The first spring contact 14 and the second spring contact 15 presses against the first busbar 2 and the second busbar 3, respectively. Thus, the first spring contact 14 provides an electrical connection between the first busbar 2 and the circuit board 13 while the second spring contact 15 provides an electrical connection between the second busbar 3 and the circuit board 13. The circuit board 13 is attached to the first portion 24 of the housing 4 by at least one screw which is inserted through one hole of the circuit board 13. The electrical contact between the midpoint 11 of the circuit board 13 and the housing 4 can be adjusted by tightening such a screw. The second portion 25 of the housing 4 is attached to the first portion 24 of the housing 4. The second portion 25 may be made from a plastic material.

Figure 10:
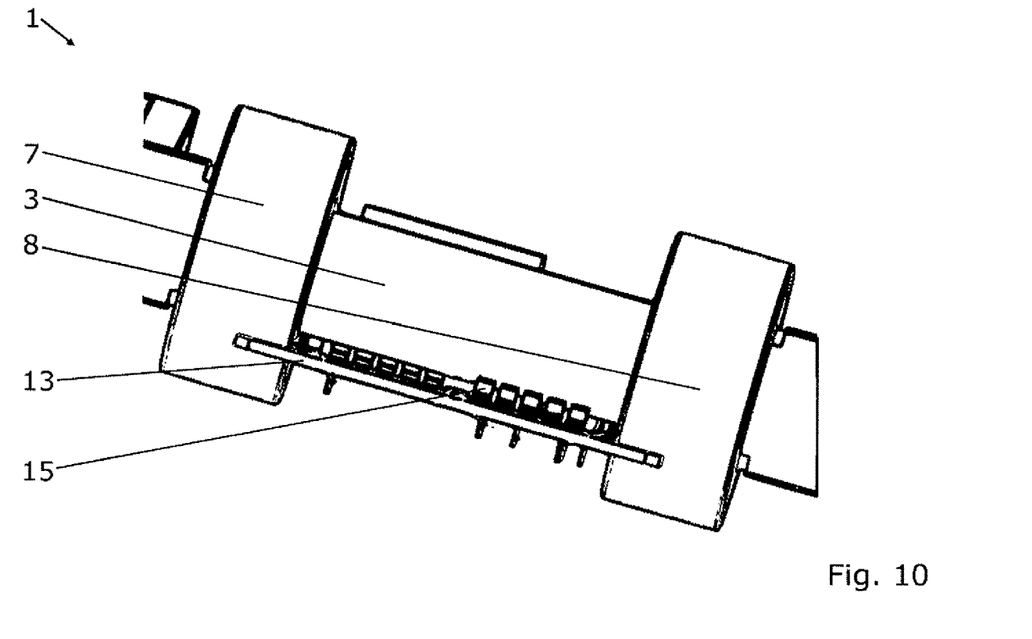
FIG. 10 shows another perspective view of the preassembled circuit board with busbars.

FIG. 10 shows a perspective view of the preassembled circuit board with busbars, in which the first busbar 2 and the second busbar 3 each are spaced apart from the circuit board 13, and wherein the first spring contact 14 forms an electrical connection between the circuit board 13 and the first busbar 2, while the second spring contact 15 forms an electrical connection between the circuit board 13 and the second busbar 3.

The invention claimed is:

1. A filter module for reducing differential and common mode electrical noise comprising:
   at least a first electrically conductive busbar and a second electrically conductive busbar spaced apart from the first busbar;
   an at least partially electrically conductive housing at least partially enclosing the first busbar and the second busbar;
   at least a first common mode choke and a second common mode choke arranged in the housing and spaced apart from each other, the first common mode choke formed by a first ferrite core through which the first busbar and the second busbar extend, and the second common mode choke formed by a second ferrite core through which the first busbar and the second busbar extend;
   at least a first bypass capacitor electrically connected to the first busbar and the second busbar,
   at least a second bypass capacitor electrically connected to the first busbar and a midpoint; and
   at least a third bypass capacitor electrically connected to the second busbar and the midpoint, said midpoint electrically connected to the housing,
   wherein the first bypass capacitor, the second bypass capacitor and the third bypass capacitor are arranged on a circuit board, the circuit board is arranged in the housing between the first ferrite core and the second ferrite core, and the circuit board having at least a first spring contact and a second spring contact and a second spring contact,
   wherein the first spring contact provides an electrical connection between the circuit board and the first busbar, and the second spring contact provides an electrical connection between the circuit board and the second busbar,
   wherein the first busbar and the second busbar each are spaced apart from the circuit board,
   wherein a surface of the first busbar facing the circuit board is minimized and wherein a surface of the second busbar facing the circuit board is minimized.

2. The filter module according to claim 1, wherein the first busbar and/or the second busbar have at least partially an insulating sheath.

3. The filter module according to claim 2, wherein at least a part of the insulating sheath of the first busbar and/or the second busbar forms a mounting for the first ferrite core and/or for the second ferrite core.

4. The filter module according to claim 1, wherein the first ferrite core has a toroidal shape and/or the second ferrite core has a toroidal shape.

5. The filter module according to claim 1, wherein the first ferrite core is made of one piece and/or the second ferrite core is made of one piece.

6. The filter module according to claim 1, wherein the first spring contact comprises at least two spring fingers and/or the second spring contact comprises at least two spring fingers.

7. The filter module according to claim 1, wherein the first bypass capacitor is a class-X capacitor while the second bypass capacitor and the third bypass capacitor are class-Y capacitors.

8. The filter module according to claim 1, further comprising;
   at least a fourth bypass capacitor electrically connected to the first busbar and the second busbar;
   at least a fifth bypass capacitor electrically connected to the first busbar and the midpoint; and
   at least a sixth bypass capacitor electrically connected to the second busbar and the midpoint;
   wherein the fourth bypass capacitor, the fifth bypass capacitor and the sixth bypass capacitor are arranged on the circuit board.

9. The filter module according to claim 8, wherein the first busbar and the second busbar divide the circuit board in a first part and a second part.

10. The filter module according to claim 9, wherein the first bypass capacitor, the second bypass capacitor, and the third bypass capacitor are arranged on the first part of the circuit board, while the fourth bypass capacitor, the fifth bypass capacitor, and the sixth bypass capacitor are arranged on the second part of the circuit board.

11. The filter module according to claim 1, wherein the first spring contact forms an electrical connection between the circuit board and the first busbar, while the second spring contact forms an electrical connection between the circuit board and the second busbar.

12. The filter module according to claim 1, wherein the first spring contact is electrically connected to a conductor track and/or an electrical line of the circuit board, and wherein the second spring contact is electrically connected to a conductor track and/or electrical line of the circuit board.

13. The filter module according to claim 1, wherein the first busbar and the second busbar are facing the same side of the circuit board, and/or wherein the first spring contact and the second spring contact are arranged on the same side of the circuit board.

14. The filter module according to claim 1, wherein the first spring contact and the second spring contact each are formed from electrically conductive material.

15. A method to manufacture a filter module according to claim 1, the method comprising the following steps:
   providing the at least partially electrically conductive housing with at least a first portion and a second portion; and
   providing the first electrically conductive busbar with the first ferrite core and the second electrically conductive busbar with the second ferrite core, the first busbar, the second busbar, and the first and second ferrite cores are placed in the first portion of the housing.

16. The method according to claim 15, further comprising:
   providing a circuit board which is preassembled with the first, second, and third bypass capacitors, the first spring contact, and the second spring contact,
   placing the circuit board between the first and second ferrite cores, such that the first busbar and the second busbar are at least partially arranged between the circuit board and the first portion of the housing, the first spring contact and the second spring contact electrically contacting the first busbar and the second busbar, respectively; and
   attaching the circuit board to the first portion of the housing.

17. The method according to claim 16, wherein the circuit board is attached to the first portion of the housing by at least one screw.

18. The method according to claim 17, wherein the electrical contact between the midpoint of the circuit board and the housing is adjusted by tightening the screw.

19. The method according to claim 16, wherein the first busbar and the second busbar are connected to the first spring contact and to the second spring contact, respectively, by moving the preassembled circuit board towards the first busbar and the second busbar along a direction perpendicular to the circuit board surface on which the first spring contact and the second spring contact are preassembled.

20. The method according to claim 19, wherein the first spring contact and the second spring contact are soldered onto the circuit board in the same process step in which the other components are soldered onto the circuit board.

21. The method according to claim 15 wherein the second portion of the housing is attached to the first portion of the housing.

* * * * *